April 11, 1967 K. G. PERKINS 3,314,014
FREQUENCY COMPARING SYSTEMS
Filed Feb. 7, 1964
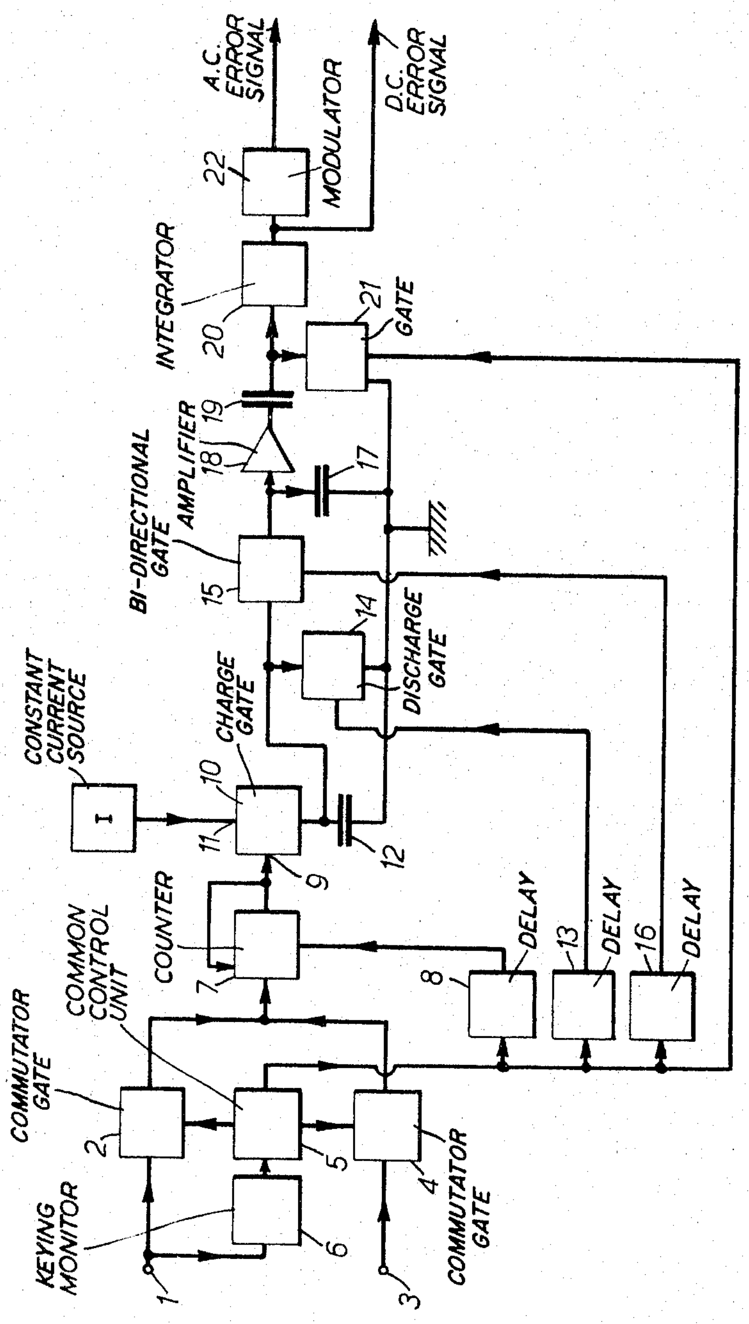

United States Patent Office 3,314,014

Patented Apr. 11, 1967

3,314,014

FREQUENCY COMPARING SYSTEMS

Kenneth George Perkins, Cranham, Essex, England, assignor to Plessey U.K. Limited, a British company Filed Feb. 7, 1964, Ser. No. 343,420
Claims priority, application Great Britian, Feb. 21, 1963, 6,946/63
8 Claims. (Cl. 328—134)

This invention relates to frequency comparing systems. In particular the invention can be applied to a frequency control system.

Previously known automatic frequency control systems have often used some form of frequency or phase system which is susceptible to change of temperature and which thus requires some adjustment to be made to compensate for the change.

It is an object of the present invention to provide a frequency comparing system in which the susceptibility to temperature variation is eliminated or at least reduced.

According to the present invention we provide a frequency comparison system capable of comparing a signal frequency with a reference frequency comprising commutating means arranged, in use, to commutate the signal with a reference frequency so as to produce a resultant waveform consisting of alternate elements of the signal frequency and reference frequency and further means connected to this commutating means so as to be responsive to said resultant waveform to produce an output signal which is characteristic of the frequency difference between the signal frequency and the reference frequency.

The said further means may include a counter and the commutating means may be such that each element of the resultant waveform comprises a number of cycles of the reference frequency or the signal, the counter being arranged, in use, to count a predetermined number of cycles of each element of the resultant waveform so as to produce an output pulse for each element whose duration is characteristic of the frequency of each element, successive output pulses, alternately characteristic of the reference frequency and the signal frequency, being compared in comparison means so as to produce a frequency difference output signal.

The comparison means may include converter means arranged so as to be capable of producing corresponding pulses, whose amplitudes are characteristic of the reference frequency and signal frequency, from the output pulses from the counter, a capacitor being arranged so as to be charged or partially discharged by said corresponding pulses dependent upon their amplitudes, and sampling means being arranged so as to sample the charge on the capacitor for each successive corresponding pulse so as to produce the frequency difference output pulse.

The commutating means may include two gates each having an input terminal arranged to be supplied respectively with the reference frequency or the signal, each having a control input connected with common control means for alternately opening the gates and each having an output terminal connected to a common input terminal in the further means.

The counter may be actuable by the common control means, via delay means for each actuation of the gates, the delay being provided to ensure that the element being passed to the counter has reached it.

The common control means may be linked by synchronizing means to the input of the gate arranged to receive the signal, the synchronizing means being operable to synchronize the common control means so as to cause said gate to be opened when said signal comprises the signal frequency to be compared whereby, for example, a predetermined frequency of a frequency shift keying signal can be compared.

The converter means may comprise a further capacitor arranged so as to be charged by constant current for a period determined by the duration of the output pulses from the counter, the further capacitor being arranged to be discharged, by means controlled by said common control means, before charging under control of each counter output pulse.

The further capacitor may be arranged to be connected across said capacitor by a bi-directional gate, under control of the common control means, whereby the two capacitors share their respective charges.

The voltage across said capacitor may be arranged to be fed via an A.C. coupled amplifier to an integrating circuit, the integrating circuit being operable to produce a D.C. signal representative of the frequency difference between the signal frequency and the reference frequency.

The system may include D.C. restoring means, controlled by the common control means, arranged so as to effect D.C. restoration of said capacitor when the counter output pulse is characteristic of the reference frequency, whereby the sign of the error is apparent in the frequency difference output pulse.

The foregoing and further features of the invention will become apparent from the following description of a preferred embodiment with reference to the accompanying drawing which shows a block schematic diagram of an automatic frequency control system incorporating features of the present invention.

An input signal whose frequency is to be compared is fed to an input terminal 1 which is connected with the input side of a commutator gate 2. A reference frequency source (not shown) is connected with a terminal 3 which is connected to the input side of a second commutator gate 4. The operation of the gates 2 and 4 is controlled by a common control unit which may be a bi-stable multivibrator whose operation is synchronised, with any keying which may be on the signal applied to the terminal 1, by a keying monitor 6 which is fed with the signal and can be frequency of amplitude sensitive and which may take the form of a frequency demodulator or envelope detector to correspond with frequency shift keying or amplitude modulation keying respectively. In the absence of any keying on the signal appearing at terminal 1 the keying monitor 6 can be replaced by a suitable internal waveform generator. The keying synchronization is effected to ensure that frequency comparison is only effected in the signal at certain instants of times, i.e., not during a period when the signal may be switching between two frequencies.

The two gates 2 and 4 are opened alternately under control of common control unit 5, the combined outputs from the gates being fed to the input of a counter 7. The input applied to the counter 7 consists of a waveform of alternate elements of the signal and the reference frequency from the gates 2 and 4 respectively.

The counter 7 is actuated to initiate counting under control of control pulses derived from the common control unit 5 via delay unit 8. The delay unit 8 is provided to ensure that the counter 7 does not begin counting until an element of the waveform, containing a number of cycles of the reference frequency or signal frequency, has arrived at the counter 7 from one of the gates 2 or 4. The counter 7 is thereafter actuated by the successive cycles of the element of the waveform. The counter 7 is arranged to provide an output pulse whose duration is determined by a predetermined number of counts of the counter 7. Hence for each element of signal frequency or reference frequency passing into the counter an output pulse is obtained therefrom having a duration which is inversely proportional to the frequency of the particular element passing therethrough.

In a particular arrangement the counter 7 can be a four-stage binary counter and the output pulse can be arranged to start on the fifth and finish on the ninth frequency cycle. This arrangement avoids any lack of phase coherence between the signal and the keying waveform. The output from the counter 7 is applied to the control pulse input 9 of a charge gate 10.

A constant current source I is connected to the input 11 of the gate 10 and the output side of the gate 10 is connected to one electrode of a capacitor 12, the other electrode being connected to earth. The capacitor 12 is charged to a voltage which is inversely proportional to the frequency of each element of the waveform, hence providing a conventional pulse duration modulation to pulse amplitude modulation conversion.

A gate 14 is provided across capacitor 12 and is actuable by the common control unit 5 via a delay unit 13 for discharging capacitor 12. The capacitor 12 is discharged, at a time which is near the start of each element passing through the counter in order to avoid the introduction of errors arising from any residual charge which may be on the capacitor due to a previous occasion when the gate 10 was opened. A control pulse from the common control unit 5 via a delay unit 13 operates discharge gate 14 such that when the gate 14 is open the capacitor 12 remains charged and when the gate 14 is closed the capacitor is discharged through to earth.

One input of a bi-directional gate 15 is connected with the capacitor 12. The operation of the gate 15 is controlled by pulses which are derived from the common control unit 5 via a further delay unit 16 the output side of the gate 15 being connected with one electrode of a capacitor 17. With this arrangement when a pulse is applied to the gate 15, via the delay unit 16, with the object of opening the gate 15 the voltage on the capacitor 12 is sampled and is fed to the capacitor 17 so as to share its charge therewith, i.e., either to charge or discharge capacitor 17 dependent on the charge already thereon due to previous samplings.

It can be seen that when the signal frequency is different to the reference frequency the charge on capacitor 17 will vary for each element of the waveform passing through gates 2 and 4. Hence the voltage across capacitor 17 is a low amplitude square-wave signal whose amplitude is proportional to the frequency error, the voltage on capacitor 17 providing an indication of the difference between the voltage levels appearing at the capacitor 12 due to the reference frequency and signal frequency elements. It should be noted that even though the gate 15 is a bi-directional gate the capacitor 17 is not discharged during the periods when the gate 14 discharges the capacitor 12, this being because gate 15 is only open for the sampling of the charge on capacitor 12 when it is fully charged by an element of the waveform and not while it is being discharged.

The low amplitude square-wave signal voltage across capacitor 17 is passed via an A.C. coupled amplifier 18 and a capacitor 19 to an integrater unit 20. The output from the integrater circuit 20 is a D.C. error signal. If it is required to obtain an A.C. error signal the output from the integrater is fed to a modulator 22.

It is not possible to determine the sign of the frequency error, i.e., whether the signal frequency is above or below the reference frequency, from the low amplitude square-wave signal across capacitor 17. In order to be able to determine the sign of the frequency error capacitor 19 is arranged to be D.C. restored via a gate 21, controlled by the common control unit 5 for the purpose of clamping to earth the output from capacitor 19, for the time when the charge on capacitor 17 is the charge proportional to the reference frequency. Hence the charge on capacitor 19 corresponding to the reference frequency becomes effectively zero potential while the charge thereon due to the signal frequency produces a positive or negative potential according to the sign of the frequency error.

In the above described circuit the delay time of the delay unit 8, 13 and 16 are selected so as to suit the range of frequencies of input signals applied to the device. It will be appreciated that since the above system essentially makes use of the same chain of gating networks for producing pulses characteristic of both signal frequency and reference frequency any errors introduced therein will be introduced into both such sets of pulses and can hence be ignored. It should also be noted that when the signal and reference frequencies are equal there will be no fluctuation of charge on capacitor 17 hence no error signal will be produced by the device.

The above described system provides a convenient way by means of which A.C. or D.C. error signals can be obtained. Such error signals can be ultilised in any required manner.

Furthermore, since the measurements are made uniquely during each sampling period the system does not require coherent signals. In practice the time intervals required for each sampling period is as short as 5 milliseconds, in other words a previous history is not requisite for correct measurements.

The device can be switched into or out of operation in a frequency control system by manual controls and/or by a signal/noise detector, the latter being utilised to automatically cut-out the device when the signal/noise ratio become intolerable.

I claim:

1. A frequency comparison system capable of comparing a signal frequency with a reference frequency comprising commutating means arranged in use to commutate the signal frequency with the reference frequency so as to produce a resultant waveform consisting of alternate elements of the signal frequency and reference frequency wherein each element comprises a number of cycles of the reference frequency or the signal frequency as the case may be, counter means arranged in use to count a predetermined number of cycles of each element of the resultant waveform so as to produce for each element a corresponding output pulse whose duration is characteristic of the frequency of the element to which it corresponds, successive output pulses being alternately characteristic of the reference frequency and the signal frequency, converter means fed with the output pulses from the counter so as to produce corresponding pulses the amplitude of alternate ones of which are characteristic of the reference frequency and the signal frequency respectively, sampling means arranged so as to sample the amplitude of each successive corresponding pulse, and capacitor means arranged so as to be charged or partially discharged by said corresponding pulses dependent upon their sample amplitude so as to produce an output signal characteristic of the frequency difference between the signal frequency and the reference frequency.

2. A system as claimed in claim 1, wherein the commutating means includes two gates each having an input terminal arranged to be supplied respectively with the reference frequency or the signal frequency, each having a control input terminal connected with a common control means for alternately opening the gates and each having an output terminal connected to a common input terminal of the counter means.

3. A system as claimed in claim 2, wherein the counter is actuable by the common control means, via a delay means for each actuation of the gates, the delay being provided to ensure that the element being passed to the counter has reached it.

4. A system as claimed in claim 2, wherein the common control means is linked by synchronizing means to the input of the gate arranged to receive the signal frequency, the synchronizing means being operable to synchronize the common control means with keying of the signal frequency so as to cause said gate to be open when said signal frequency is to be compared.

5. A system as claimed in claim 1, wherein the said converter means comprises a further capacitor means arranged so as to be charged by a constant current for a period determined by the duration of the output pulses from the counter, the further capacitor means being arranged to be discharged by means controlled by said common control means before charging under control of each counter output pulse, thereby to develop across it said corresponding pulses.

6. A system as claimed in claim 5 wherein said further capacitor means is arranged to be connected across said capacitor means by a bi-directional gate under control of the common control means whereby the two capacitors share their respective charges.

7. A system as claimed in claim 1 wherein the voltage across said capacitor means is arranged to be fed via an A.C. coupled amplifier to an integrating circuit, the integrating circuit being operable to produce a D.C. signal representative of the frequency difference between the signal frequency and the reference frequency.

8. A system as claimed in claim 7 including D.C. restoring means controlled by the common control means arranged to effect D.C. restoration of the output of the A.C. coupled amplifier when the counter output pulse is characteristic of the reference frequency, whereby the sign of the error is apparent in the frequency difference output signal.

References Cited by the Examiner

UNITED STATES PATENTS

| | | | |
|---|---|---|---|
| 2,521,789 | 9/1950 | Grosdoff | 328—134 X |
| 2,640,106 | 5/1953 | Wilson et al. | 328—133 X |

ARTHUR GAUSS, *Primary Examiner.*

J. ZAZWORSKY. *Assistant Examiner.*